US012803508B2

(12) United States Patent
Surbahanli et al.

(10) Patent No.: US 12,803,508 B2
(45) Date of Patent: Nov. 17, 2026

(54) PLANAR COMBINER SYSTEM FOR SOLID STATE POWER AMPLIFIERS

(71) Applicant: ASELSAN ELEKTRONIK SANAYI VE TICARET ANONIM SIRKETI, Ankara (TR)

(72) Inventors: Ridvan Surbahanli, Ankara (TR); Ali Berk Demir, Ankara (TR); Ahmet Aktug, Ankara (TR); Kagan Berk Tanaydin, Ankara (TR)

(73) Assignee: ASELSAN ELEKTRONIK SANAYI VE TICARET ANONIM SIRKETI, Ankara (TR)

( * ) Notice: Subject to any disclaimer, the term of this patent is extended or adjusted under 35 U.S.C. 154(b) by 702 days.

(21) Appl. No.: 18/192,731

(22) Filed: Mar. 30, 2023

(65) Prior Publication Data

US 2023/0318545 A1 Oct. 5, 2023

(30) Foreign Application Priority Data

Apr. 1, 2022 (TR) ................................ 2022/005093

(51) Int. Cl.
*H03F 3/21* (2006.01)
*H03F 1/02* (2006.01)

(52) U.S. Cl.
CPC ........... *H03F 3/211* (2013.01); *H03F 1/0205* (2013.01); *H03F 2200/451* (2013.01); *H03F 2203/21142* (2013.01)

(58) Field of Classification Search
CPC ...... H01P 5/12; H01P 5/18; H01P 5/20; H01P 5/16; H01P 5/186; H03F 3/211; H03F 1/0205; H03F 2200/451; H03F 2203/21142; H03F 2200/204; H03F 3/24; H03F 3/195; H03F 3/60
See application file for complete search history.

(56) References Cited

U.S. PATENT DOCUMENTS

| | | | | |
|---|---|---|---|---|
| 9,065,163 | B1 * | 6/2015 | Wu | H03F 3/211 |
| 2010/0093293 | A1 * | 4/2010 | Grebennikov | G01S 13/87 455/150.1 |

FOREIGN PATENT DOCUMENTS

| | | | |
|---|---|---|---|
| JP | 2012049909 | A | 3/2012 |

* cited by examiner

*Primary Examiner* — Andrea Lindgren Baltzell
*Assistant Examiner* — Malane Lieng
(74) *Attorney, Agent, or Firm* — Bayramoglu Law Offices LLC

(57) ABSTRACT

A planar combiner system for use in high-power multi-component power amplifier architectures in solid-state amplifiers is realized by planar placement of a wideband, low-loss, insulated and compact asymmetric Lange coupling and Wilkinson-type combiner on a base with high thermal conductivity and electrical resistance, allowing the amplifiers to directly contact the cold plate.

18 Claims, 4 Drawing Sheets

PLANAR COMBINER SYSTEM FOR SOLID STATE POWER AMPLIFIERS

CROSS REFERENCE TO THE RELATED APPLICATIONS

This application is based upon and claims priority to Turkish Patent Application No. 2022/005093, filed on Apr. 1, 2022, the entire contents of which are incorporated herein by reference.

TECHNICAL FIELD

The invention relates to a planar combiner for use in high-power multi-component power amplifier architectures in solid-state amplifiers, which is realized by using a broadband, low-loss, isolated and compact asymmetric Lange coupling and Wilkinson-type combiner on a base with high thermal conductivity and electrical resistance.

BACKGROUND

In order to amplify the incoming signal to usable power in semiconductor power amplifiers, solid-state power amplifiers split the incoming signal power into multiple parts and transmit each signal to linear power amplifiers, where the amplified signals are combined. In the prior art, symmetrical Lange coupling are often used among planar signal couplings.

In combiners using symmetric Lange coupling, regional performance losses occur due to the shift of the impedances before the power amplifiers from the optimum point under large signal. In the current state of the art, there are problems such as increased return losses at the input ports under large signal conditions due to moving away from the ideal impedance, decreased performance of nonlinear power amplifiers, and decreased overall combining efficiency.

The main problem with stripline or coaxial type combiners, which are low-loss combiners, is the need to use complex manufacturing techniques and the high losses due to different media transitions (microstrip-coax, microstrip-stripline, etc.) and input return losses to power amplifiers. Non-planar combining techniques are suitable for combining a large number of power amplifiers with low losses, but they have many disadvantages such as the complexity of the cooling structure, difficulty in manufacturing and repair, and low isolation.

In FIG. 1, the effect of the return reflection loss on the output power of the power amplifier under a large signal is shown. It is seen that each 0.1 dB change in the dB scale can seriously affect the system performance in power amplifier design, considering that a 1 dB change can cause an output power drop of 21%. Since power amplifiers are designed for specific impedances (500 hm, 750 hm, etc.), they are characterized under these impedances. Since the loads that deviate from these impedance values affect many parameters of the power amplifiers such as gain, efficiency, output power, linearity and lifetime, the input return losses to the power amplifiers under large signal must be kept at the lowest level.

In the prior art, Lange-Lange combining has disadvantages in terms of amplitude at equilibrium, but the return loss of the common junction is well below −20 dB, even if the coupled junctions are short-circuited. Wilkinson-Wilkinson type combining has advantages in terms of amplitude at equilibrium, but the return loss of the common junction depends on the impedance of the joined junctions. Since the use of Lange couplings and Wilkinson couplings alone for combining high amplitude signals in wideband applications does not provide the expected output power and input return losses, Lange and Wilkinson couplings can be used together in a sequential combining structure. FIG. 2 shows the geometrical structure of the power combining elements when Lange and Wilkinson couplings are used in a sequential combining structure. In linear applications using in-line coupling, a long coupling path between the couplers is mandatory, which increases losses and phase and intensity mismatches between the combined signals.

During the search in the present art, application number JP2012049909A was found. The application relates to a high bandwidth amplifier. In the application, it is mentioned that Wilkinson and Lange type power combiners are used. However, in the application, it is not mentioned that the Lange coupling and Wilkinson-type combiner are manufactured on a high thermal conductivity, high electrical resistivity base to obtain a compact and planar multipath combiner.

As a result, it has been deemed necessary to make a development in the relevant technical field due to the above-mentioned negativities and the inadequacy of the existing solutions on the subject.

SUMMARY

The main purpose of the invention is to realize a planar combiner system for use in high power multi-component power amplifier architectures in solid state amplifiers, which is realized by planar placement of asymmetric Lange coupling and Wilkinson type combiner with wide band, low loss, isolated and compact structure on a base with high thermal conductivity and electrical resistance, which enables the amplifiers to directly contact the cold plate.

A planar combiner system in solid-state amplifiers, for use in high-power multi-component power amplifier architectures, a wideband, low-loss, isolated and compact asymmetric Lange coupling and Wilkinson-type connector with asymmetric Lange coupling and Wilkinson-type coupling plenary placed on a base with high thermal conductivity and electrical resistance, which can directly contact the cold plate, characterized by comprising;

- multiple connectors (C) structured to transmit the signal originating from the connectors in the splitting role, and
- at least one combining module (CM) structured to be manufactured in planar arrangement on a base of high thermal conductivity and electrical resistivity, to collect and transmit the amplified signals to the radio frequency output channel;
- multiple connection paths (CL) structured to be produced in planar arrangement on a base with high thermal conductivity and electrical resistance, to perform signal transport between connectors with minimum power loss;
- at least one division module (DM) structured to be manufactured in planar arrangement on a base with high thermal conductivity and electrical resistance, to divide and distribute the signal from the radio frequency input channel into multiple channels of equal power, and
- multiple power amplifiers (PA) structured to connect the division module (DM) and the combining module (CM) with the connector (C), amplifying the divided signals from the division module (DM), and transferring the amplified signals to the combining module (CM).

The structural and characteristic features and all the advantages of the invention will be more clearly understood by means of the figures given below and the detailed description written by making references to these figures. Therefore, the evaluation should be made by taking these figures and the detailed description into consideration.

DESCRIPTION OF PART REFERENCES

C: Cable
CM: Combining module
CL: Connection path
DM: Division Module
PA: Power amplifier

DETAILED DESCRIPTION OF THE EMBODIMENTS

In this detailed description, the preferred embodiments of the invention are described solely for the purpose of a better understanding of the subject matter and without limiting effect.

The inventive planar combiner system for use in high-power multi-component power amplifier architectures in solid-state amplifiers, which is realized by planar placement of a broadband, low-loss, insulated and compact asymmetric Lange coupling and Wilkinson-type combiner on a base with high thermal conductivity and electrical resistance, and which enables the amplifiers to directly contact the cold plate,

- multiple connectors (C) structured to transmit the signal originating from the connectors acting as splitters;
- at least one combining module (CM) configured to be structured in planar arrangement on a base with high thermal conductivity and electrical resistance, to collect and transmit the amplified signals to the radio frequency output channel;

Multiple connection paths (CL) structured to be produced in planar arrangement on a base of high thermal conductivity and electrical resistivity, structured to carry signals between connectors with minimum power loss;

- at least one division module (DM) structured in a planar arrangement, configured to distribute the signal from a radio frequency input channel by dividing it into multiple channels of equal power;
- includes multiple power amplifiers (PAs) structured to connect the division module (DM) and the combining module (CM) with the connector (C), amplify the split signals from the division module (DM), and transfer the amplified signals to the combining module (CM).

Figure 1:
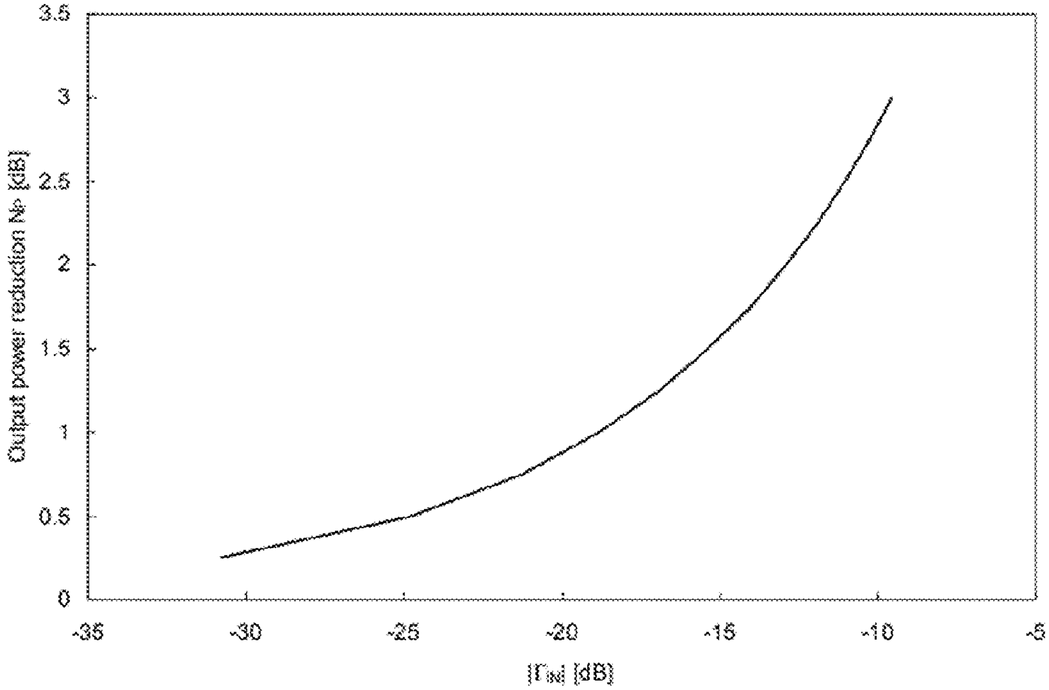
FIG. 1 (Prior Art)
FIG. 1 is a graphic of the effect of input return loss on output power loss (Andries Pieter de Hek, "Design, Realisation and Test of GaAs-based Monolithic Integrated X-band High-Power Amplifiers", 2002.).
Figure 2:
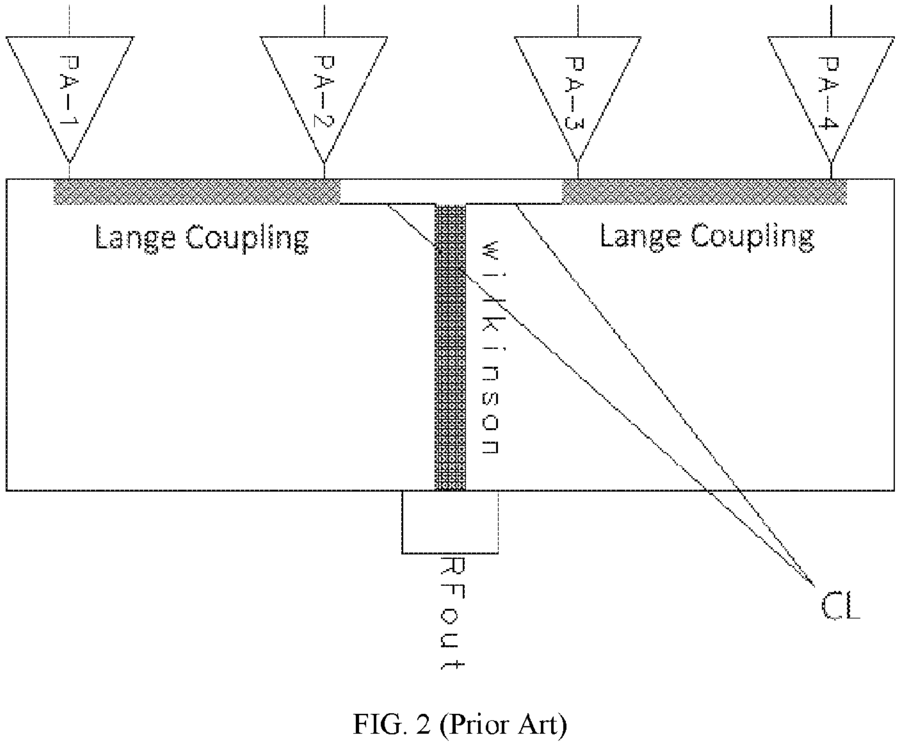
FIG. 2 (Prior Art)
FIG. 2 is an illustration of the power combining elements when using the Lange and Wilkinson combining structures in in-line combining.
Figure 3:
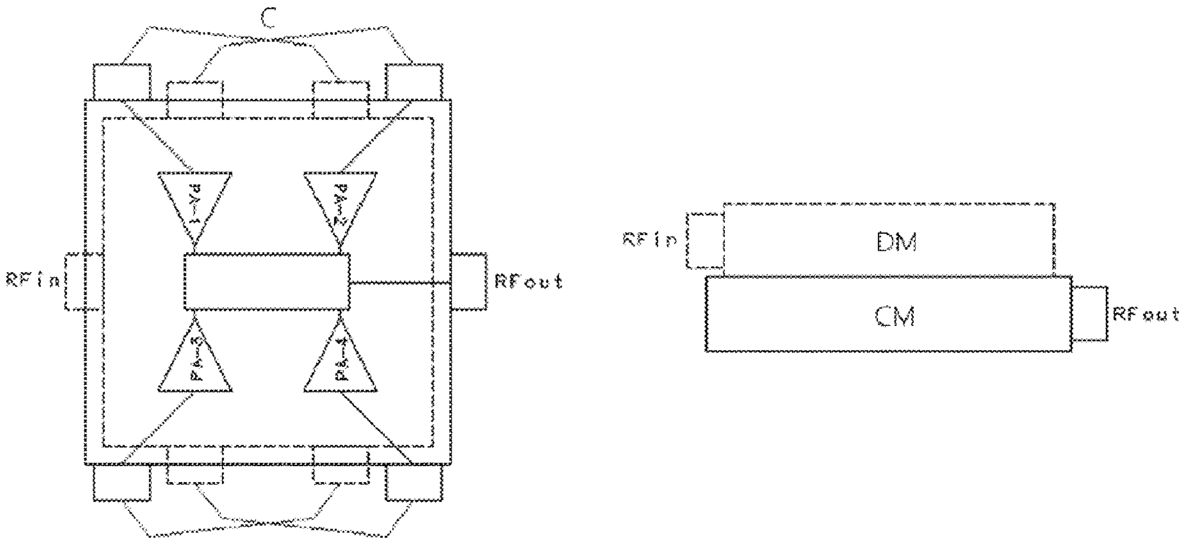
FIG. 3 is an illustration of the application of the inventive planar combiner in a 4-way power amplifier topology.

FIG. 3 illustrates the implementation of the inventive planar combiner in a 4-way power amplifier topology. The connector (C) in the planar combiner of the invention is configured to transmit the signal from the connectors in the splitting function. In a preferred embodiment of the invention, the connector (C) is structured to carry the signal divided by the splitting module (DM) to the input of the power amplifier (PA). In an embodiment of the invention, the connector (C) is structured as an electrical connection in the form of a cable, microstrip or stripline.

Figure 4:
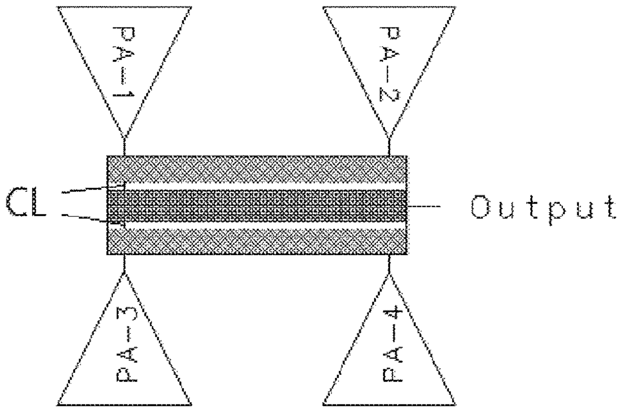
FIG. 4 shows the power combiner in the coupling structure proposed by the invention.
Figure 5:
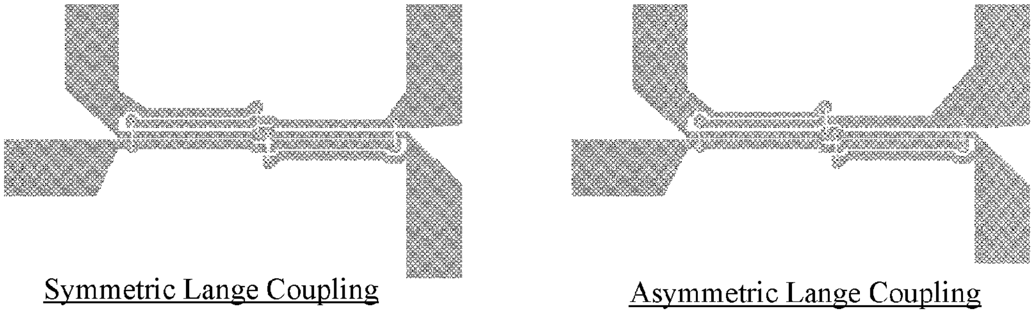
FIG. 5 is an illustration of the layout of a standard Lange combining and an asymmetric Lange combining, respectively.
Figure 6:
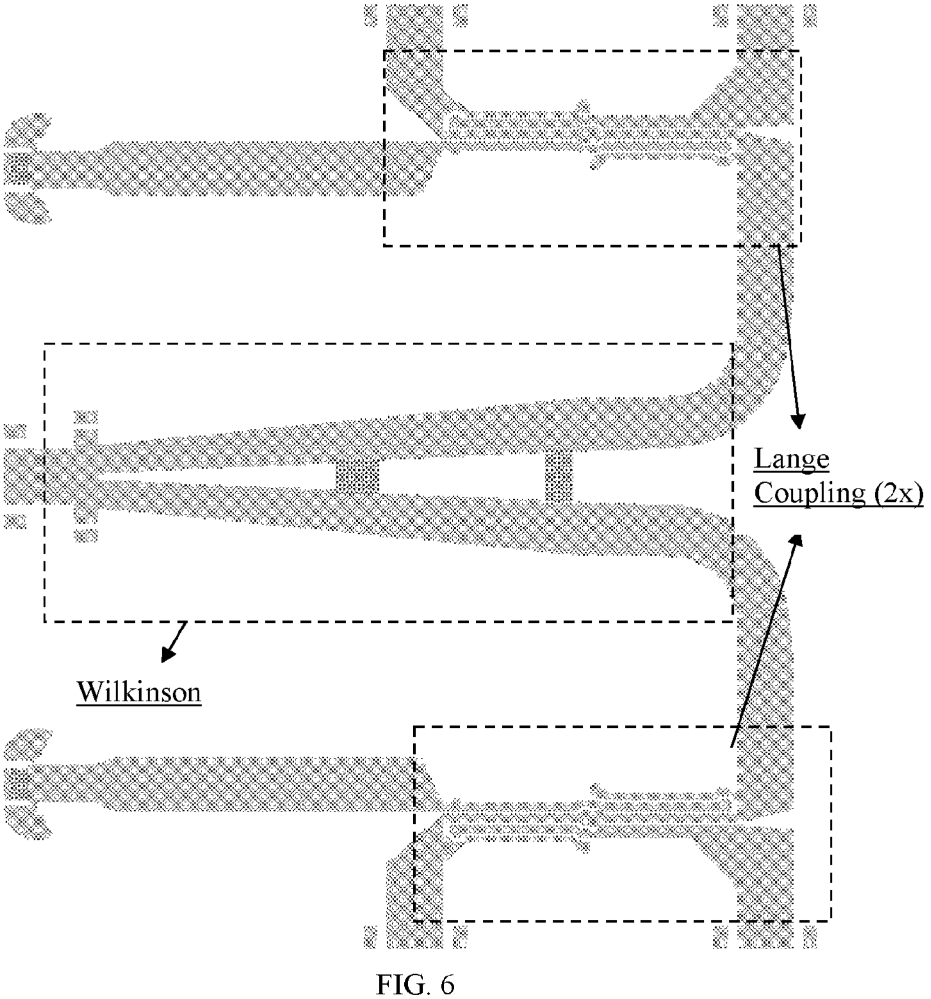
FIG. 6 is an illustration of a 4-way broadband combiner layout.

FIG. 4 shows the power combining in the combining structure proposed by the invention. The combining module (CM) in the planar combiner of the invention is structured to be manufactured in a planar arrangement on a base with high thermal conductivity and electrical resistance, to collect the amplified signals and transmit them to the radio frequency output channel. FIG. 5 shows the layout of a standard Lange coupler and an asymmetric Lange coupling, respectively. FIG. 6 is an illustration of the layout of a 4-way broadband coupler. In one embodiment of the invention, the combining module (CM) is configured to be fabricated in the signal combining architecture of FIG. 6, which comprises at least two of the symmetrical Lange coupling shown in FIG. 5 and at least one of the Wilkinson coupling shown in FIG. 6, positioned in a compact layout. In an embodiment of the invention, the combining module (CM) is structured to be produced in the signal combining architecture of FIG. 6, which is compactly arranged and comprises at least two of the asymmetric Lange coupling shown in FIG. 5 and at least one of the Wilkinson coupling shown in FIG. 6. In an embodiment of the invention, the combining module (CM) is structured to be produced with an asymmetric Lange coupling with return loss of at most −20 dB and a Wilkinson coupling for amplifying the amplitude at equilibrium. In the preferred embodiment of the invention, the combining module (CM) is configured to be multiplexed to include more than one of the signal combining architecture of FIG. 6.

The connection path (CL) in the planar coupler of the invention is structured to be produced in a planar arrangement on a base with high thermal conductivity and electrical resistance, and to carry the signal between the couplers with minimum power loss. In the preferred embodiment of the invention, the coupling path (CL) is structured to connect the asymmetric Lange coupling to the Wilkinson coupling with the shortest distance and with a steep connection angle with respect to the sequential connection in order to provide the compact architecture shown in FIG. 4.

The division module (DM) in the planar combiner of the invention is structured to be produced in a planar arrangement and to divide and distribute the signal coming from the radio frequency input channel into multiple channels of equal power. In the preferred embodiment of the invention, the splitting module (DM) is structured to be manufactured in the signal combining architecture of FIG. 6, which is compactly arranged and comprises at least two of the symmetrical or asymmetrical Lange couplers shown in FIG. 5 and at least one of the Wilkinson coupling shown in FIG. 6. In a preferred embodiment of the invention, the division module (DM) is structured to be multiplexed to comprise more than one of the signal combining architecture of FIG. 6.

The power amplifier (PA) in the planar combiner of the invention is structured to connect the division module (DM) and the combining module (CM) with the connection element (C), to amplify the divided signals from the division module (DM), and to transfer the amplified signals to the combining module (CM).

Figure 7:
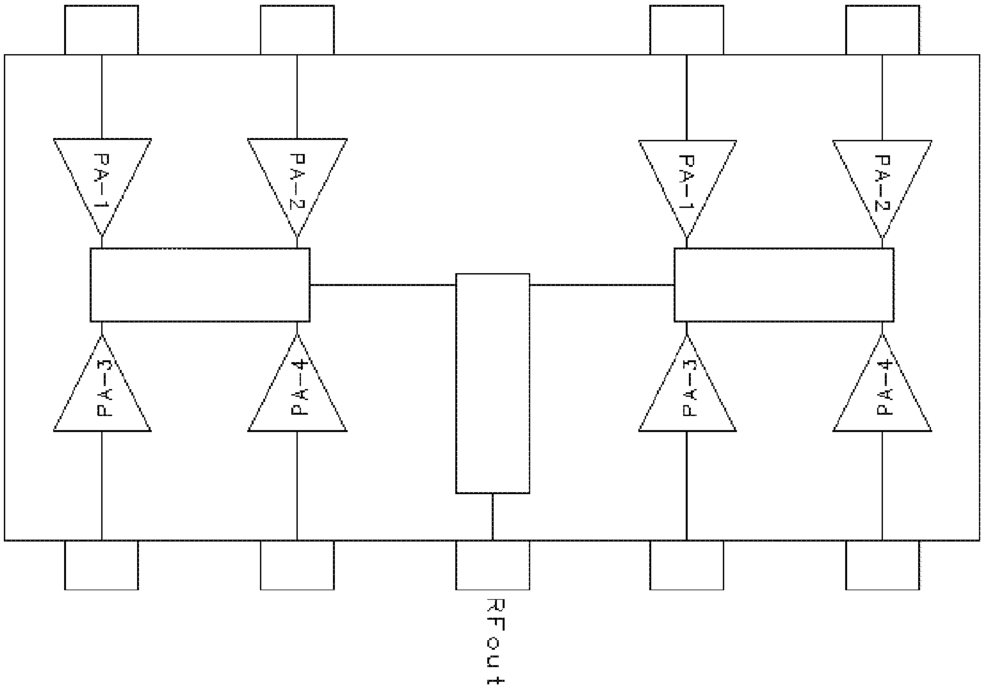
FIG. 7 is an illustration of the 8-way combining module in the inventive structure.
Figure 8:
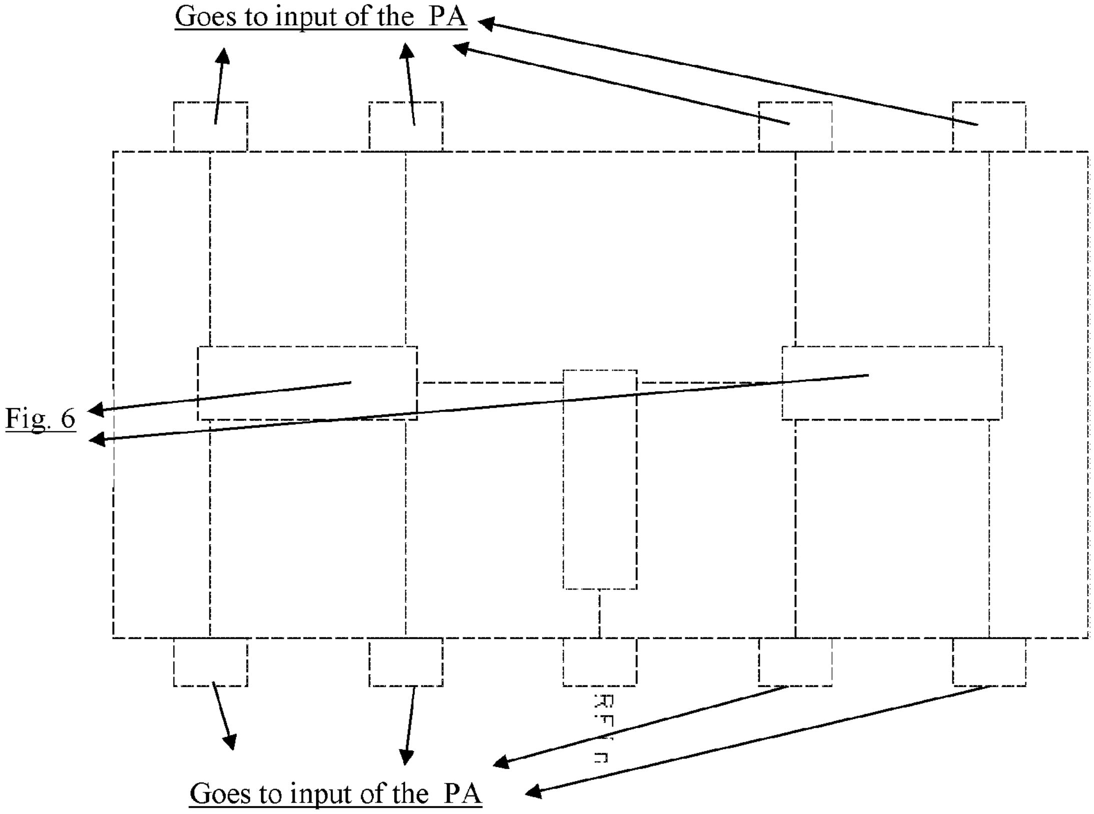
FIG. 8 is an illustration of the 8-way partition module in the inventive structure.

FIG. 7 is an illustration of the 8-way combining module (CM) in the structure according to the invention. FIG. 8 is an illustration of an 8-way division module (DM) within the inventive structure. In one embodiment of the invention, the division module (DM) is structured to enable the incoming signal to be divided into more than four signals of equal power using more than one of the signal combining architecture of FIG. 6, and each of the divided signals to be fed to an independent power amplifier (PA). In an embodiment of the invention, the combining module (CM) is structured to combine signals amplified at more than four power amplifiers (PAs) using more than one of the signal combining architecture of FIG. 6.

APPLICATION OF THE INVENTION TO INDUSTRY

The division module (DM) in the planar combiner of the invention is manufactured in at least one signal combining architecture to divide the signal coming from the input channel into a number of signals of equal power suitable for the application, the divided signal is transferred to the power amplifiers (PA) with the connecting elements (C), the amplified signals are fed to the combining module (CM) manufactured in at least one signal combining architecture to combine a number of signals suitable for the application. The signal combining architecture inside the combining module (CM) and the division module (DM) is manufactured on a base with high thermal conductivity and electrical resistance by placing asymmetric Lange and Wilkinson couplings in a parallel compact position and connecting them with the shortest perpendicular connection paths (CL).

What is claimed is:

1. A planar combiner system for a solid-state amplifier, comprising:

- a base having thermal conductivity and electrical resistivity;
- at least one division module (DM) fabricated in planar form on the base and configured to divide a radio frequency input signal into multiple channels of equal power;
- multiple power amplifiers (PA), each having an input coupled to a respective output of the division module (DM) and an output providing an amplified signal;
- at least one combining module (CM) fabricated in planar form on the base and configured to combine the amplified signals to a radio-frequency output;
- multiple connectors (C) arranged to carry signals between the division module, the power amplifiers, and the combining module;
- multiple planar connection paths (CL) on the base to transport signals between couplers with minimum power loss;
- wherein at least one of the division module (DM) and the combining module (CM) includes at least two Lange couplers and at least one Wilkinson coupler; and
- wherein one of the multiple planar connection paths (CL) is structured to connect one of the at least two Lange couplers that is an asymmetric Lange coupler to the at least one Wilkinson coupler with a shortest distance between the asymmetric Lange coupler and the Wilkinson coupler and with a steep connection angle relative to a sequential in-line connection, the couplers being positioned in parallel to provide a compact architecture.

2. The planar combiner system according to claim 1, wherein at least one of the multiple connectors (C) is structured to carry a signal divided by the division module (DM) to an input of one of the multiple power amplifiers (PA).

3. The planar combiner system according to claim 1, wherein at least one of the multiple connectors (C) is configured as an electrical connection in a form of a cable, microstrip or stripline.

4. The planar combiner system according to claim 1, wherein the combining module (CM) is positioned in a compact layout and includes the at least two Lange couplers and the at least one Wilkinson coupler, the at least two Lange couplers being symmetric Lange couplers.

5. The planar combiner system according to claim 1, wherein the combining module (CM) is positioned in a compact layout and includes the at least two Lange couplers and the at least one Wilkinson coupler, the at least two Lange couplers being asymmetric Lange couplers.

6. The planar combiner system according to claim 5, wherein one of the at least two asymmetric Lange couplers has a return loss of at most −20 dB, and the at least one Wilkinson coupler is configured to amplify an amplitude at equilibrium.

7. The planar combiner system according to claim 1, wherein the combining module (CM) includes the at least two Lange couplers and the at least one Wilkinson coupler as one set and is multiplexed by including one or more additional sets, each additional set comprising at least two Lange couplers and at least one Wilkinson coupler.

8. The planar combiner system according to claim 3, wherein the combining module (CM) is positioned in a compact layout and includes the at least two Lange couplers and the at least one Wilkinson coupler, the at least two Lange couplers being symmetric Lange couplers.

9. The planar combiner system according to claim 1, wherein the division module (DM) is positioned in a compact layout and includes the at least two Lange couplers and the at least one Wilkinson coupler, the at least two Lange couplers being symmetrical or asymmetrical Lange couplers.

10. The planar combiner system according to claim 1, wherein the division module (DM) includes the at least two Lange couplers and the at least one Wilkinson coupler as one set and is multiplexed by including one or more additional sets, each additional set comprising at least two Lange couplers and at least one Wilkinson coupler.

11. The planar combiner system according to claim 10, wherein an incoming signal is split into more than four signals of equal power by using the more than one set included in the division module (DM), and the division module (DM) is structured to enable each of the split signals to be fed to an independent power amplifier (PA).

12. The planar combiner system according to claim 7, wherein the combining module (CM) is structured to combine signals amplified in more than four power amplifiers (PAs) using the more than one set included in the combining module (CM).

13. The planar combiner system according to claim 2, wherein the at least one of the multiple connectors (C) is configured as an electrical connection in a form of a cable, microstrip or stripline.

14. The planar combiner system according to claim 2, wherein the combining module (CM) is positioned in a compact layout and includes the at least two Lange couplers and the at least one Wilkinson coupler, the at least two Lange couplers being symmetric Lange couplers.

15. The planar combiner system according to claim 2, wherein the combining module (CM) is positioned in a compact layout and includes the at least two Lange couplers and the at least one Wilkinson coupler, the at least two Lange couplers being asymmetric Lange couplers.

16. The planar combiner system according to claim 3, wherein the combining module (CM) is positioned in a compact layout and includes the at least two Lange couplers and the at least one Wilkinson coupler, the at least two Lange couplers being asymmetric Lange couplers.

17. The planar combiner system according to claim 15, wherein one of the at least two asymmetric Lange couplers has a return loss of at most −20 dB, and the at least one Wilkinson coupler is configured to amplify an amplitude at equilibrium.

18. The planar combiner system according to claim 16, wherein one of the at least two asymmetric Lange couplers has a return loss of at most −20 dB, and the at least one Wilkinson coupler is configured to amplify an amplitude at equilibrium.

* * * * *